(12) United States Patent
Chen et al.

(10) Patent No.: US 10,748,483 B2
(45) Date of Patent: Aug. 18, 2020

(54) DRIVE CONTROL CIRCUIT, DRIVING METHOD THEREOF, AND DISPLAY DEVICE

(71) Applicant: KunShan Go-Visionox Opto-Electronics Co., Ltd., Kunshan, Jiangsu (CN)

(72) Inventors: Xinquan Chen, Jiangsu (CN); Xiangqian Wang, Jiangsu (CN); Xiujian Zhu, Jiangsu (CN); Mingwei Ge, Jiangsu (CN); Zheng Wang, Jiangsu (CN)

(73) Assignee: Kunshan Go-Visionox Opto-Electronics Co., Ltd., Kunshan, Jiangsu (CN)

( * ) Notice: Subject to any disclaimer, the term of this patent is extended or adjusted under 35 U.S.C. 154(b) by 0 days.

(21) Appl. No.: 16/322,054

(22) PCT Filed: Nov. 15, 2017

(86) PCT No.: PCT/CN2017/111154
§ 371 (c)(1),
(2) Date: Jan. 30, 2019

(87) PCT Pub. No.: WO2018/099267
PCT Pub. Date: Jun. 7, 2018

(65) Prior Publication Data
US 2019/0272788 A1     Sep. 5, 2019

(30) Foreign Application Priority Data
Nov. 29, 2016   (CN) .......................... 2016 1 1071901

(51) Int. Cl.
*G09G 3/3233*   (2016.01)
*G09G 3/3266*   (2016.01)
(Continued)

(52) U.S. Cl.
CPC ............ *G09G 3/3233* (2013.01); *G09G 3/32* (2013.01); *G09G 3/3225* (2013.01);
(Continued)

(58) Field of Classification Search
CPC .. G09G 3/3233; G09G 3/3225; G09G 3/3266; G09G 3/32; G09G 2310/0243;
(Continued)

(56) References Cited

U.S. PATENT DOCUMENTS

| 3,845,324 A | 10/1974 | Feucht |
| 2003/0057895 A1 | 3/2003 | Kimura |

(Continued)

FOREIGN PATENT DOCUMENTS

| CN | 1711578 A | 12/2005 |
| CN | 102402941 A | 4/2012 |

(Continued)

*Primary Examiner* — Benyam Ketema
(74) *Attorney, Agent, or Firm* — BakerHostetler

(57) ABSTRACT

A drive control circuit, a driving method thereof and a display device are provided. The drive control circuit includes a drive integrated circuit, a transmit control circuit, a scan drive circuit, and a pixel circuit. The drive integrated circuit adjusts a duty cycle of a drive signal to generate a first drive signal and transmits the first drive signal to the transmit control circuit. The drive integrated circuit decreases the amplitude of a data signal to generate a first data signal and transmits the first data signal to the scan drive circuit. The transmit control circuit converts the received first drive signal into a second drive signal with a preset duty cycle and transmits the second drive signal to the pixel circuit. The preset duty cycle of the second drive signal is greater than the duty cycle of the drive signal to be outputted.

10 Claims, 7 Drawing Sheets

(51) Int. Cl.
*G09G 3/3225* (2016.01)
*G09G 3/32* (2016.01)
*H03K 17/687* (2006.01)

(52) U.S. Cl.
CPC ... *G09G 3/3266* (2013.01); *G09G 2310/0243* (2013.01); *G09G 2320/0233* (2013.01); *H03K 17/6871* (2013.01)

(58) Field of Classification Search
CPC ... G09G 2320/0233; G09G 2300/0819; H03K 17/6871
See application file for complete search history.

(56) References Cited

U.S. PATENT DOCUMENTS

| | | | | |
|---|---|---|---|---|
| 2012/0062613 | A1* | 3/2012 | Park | G09G 3/3233 345/690 |
| 2013/0106828 | A1 | 5/2013 | Kim | |
| 2013/0194316 | A1* | 8/2013 | Park | G09G 3/3225 345/690 |
| 2013/0208587 | A1* | 8/2013 | Bala | H04W 16/14 370/230 |
| 2013/0321485 | A1 | 12/2013 | Eom et al. | |
| 2014/0125714 | A1 | 5/2014 | Pyo | |

FOREIGN PATENT DOCUMENTS

| | | |
|---|---|---|
| CN | 103810977 A | 5/2014 |
| CN | 104282269 A | 1/2015 |
| CN | 104599630 A | 5/2015 |
| CN | 104599637 A | 5/2015 |
| CN | 104751770 A | 7/2015 |
| CN | 105609053 A | 5/2016 |
| JP | 2007127918 A | 5/2007 |
| JP | 2012220565 A | 11/2012 |
| KR | 20120028426 A | 3/2012 |
| KR | 20130045096 A | 5/2013 |
| TW | 201445542 A | 12/2014 |
| TW | 201606736 A | 2/2016 |
| TW | 201636984 A | 10/2016 |
| WO | 2011158380 A | 12/2011 |

* cited by examiner

DRIVE CONTROL CIRCUIT, DRIVING METHOD THEREOF, AND DISPLAY DEVICE

CROSS-REFERENCE TO RELATED APPLICATIONS

This application is a National Stage of International patent application PCT/CN2017/111154, filed on Nov. 15, 2017, which claims priority to foreign Chinese patent application No. CN 201611071901.5, Nov. 29, 2016, the disclosures of which are incorporated by reference in their entirety.

FIELD OF THE DISCLOSURE

The disclosure relates to the field of display drive technique, and more particularly to a drive control circuit, a driving method thereof and a display device.

BACKGROUND

An active-matrix organic light emitting diode (AMOLED) is also called as "Super AMOLED Plus". Compared with a conventional liquid crystal display used in most mobile phones, AMOLED has a wider viewing angle, a higher refresh rate and a thinner size, and thus such technology has been gradually paid great attention.

In the AMOLED display driving process, a pixel circuit receives data signals loaded by a scan drive circuit and transmits drive signals loaded by control signals, so as to realize the opening and closing of each TFT in the pixel circuit, and further realize the control of brightness and darkness of a light-emitting unit corresponding to each pixel point.

However, a horizontal Mura may be formed due to various objective defects in the existing AMOLED display screen, for example, luminance difference between adjacent rows in the screen caused by defects such as hardware material properties and process errors, further causing a phenomenon of luminance unevenness in the screen, especially the horizontal luminance unevenness.

Therefore, how to improve the horizontal Mura phenomenon in the screen is the urgent technical problem that needs to be solved by those skilled in the art.

SUMMARY

The disclosure provides a drive control circuit, a driving method thereof and a display device, so as to improve the horizontal Mura phenomenon in the display screen existed in the prior art.

The disclosure adopts the following technical solutions:
A drive control circuit is provided, comprising a drive integrated circuit, a transmit control circuit, a scan drive circuit, and a pixel circuit; wherein,
the drive integrated circuit adjusts a duty cycle of a drive signal which is to be outputted, to generate a first drive signal, and transmits the first drive signal to the transmit control circuit; the drive integrated circuit decreases the amplitude of a data signal which is to be outputted, to generate a first data signal, and transmits the first data signal to the scan drive circuit;
the scan drive circuit receives the first data signal and transmits the first data signal to the pixel circuit;
the transmit control circuit, connected between the drive integrated circuit and the pixel circuit, receives the first drive signal and converts the received first drive signal to a second drive signal with a preset duty cycle, and transmits the second drive signal to the pixel circuit, the preset duty cycle of the second drive signal being greater than the duty cycle of the drive signal which is to be outputted;
the pixel circuit receives the second drive signal and controls the corresponding pixel unit according to the received second drive signal and the first data signal transmitted by the scan drive circuit.

A method for driving the drive control circuit is provided, comprising the following steps:
adjusting, by the drive integrated circuit, a duty cycle of a drive signal which is to be outputted, to generate a first drive signal, and transmitting the first drive signal to the transmit control circuit; and decreasing, by the drive integrated circuit, the amplitude of a data signal which is to be outputted, to generate a first data signal, and transmitting the first data signal to the scan drive circuit;
receiving and converting the first drive signal to a second drive signal with a preset duty cycle, and transmitting the second drive signal to the pixel circuit, by the transmit control circuit, the preset duty cycle of the second drive signal being greater than the duty cycle of the drive signal which is to be outputted; and transmitting, by the scan drive circuit, the first data signal to the pixel circuit.

Optionally, the method further comprises controlling each row of the pixel circuit, wherein the controlling each row of the pixel circuit comprises turning off the pixel circuit when the second drive signal is at a high electrical level and turning on the pixel circuit when data has been written and the second drive signal is at a low electrical level.

A display device is provided, comprising the above drive control circuit.

The advantageous effects of the disclosure are as follows:
By means of embodiments of the disclosure, a drive integrated circuit adjusts a duty cycle of a drive signal supplied to a transmit control circuit so that the generated first drive signal can cooperate with the transmit control circuit to form a second drive signal with a preset duty cycle. And decreasing the amplitude of a data signal loaded when data is written and raising the luminance of each OLED per unit time ensure that the luminance of the entire screen remains unchanged. Mura caused by luminance difference between each row of the pixel circuit only occurs for a short period of time by shortening the time during which OLED is in an illuminated state in each frame and further shortening the time during which Mura is occurred as a whole, thereby improving the horizontal Mura phenomenon exhibited when a screen displays.

DETAILED DESCRIPTION OF PREFERRED EMBODIMENTS

In order to make the purposes, the technical solutions and the advantages of the disclosure clearer, the technical solutions of the disclosure will be described below clearly and completely with reference to the specific embodiments and the corresponding drawings. It is apparent that the described embodiments are merely part of the embodiments rather than all the embodiments of the disclosure. Based on the embodiments in the disclosure, all the other embodiments obtained by those skilled in the art without paying creative work belong to the protection scope of the disclosure.

The technical solutions provided by various embodiments of the disclosure will be described below in detail with reference to the drawings.

Embodiment 1

Figure 1:
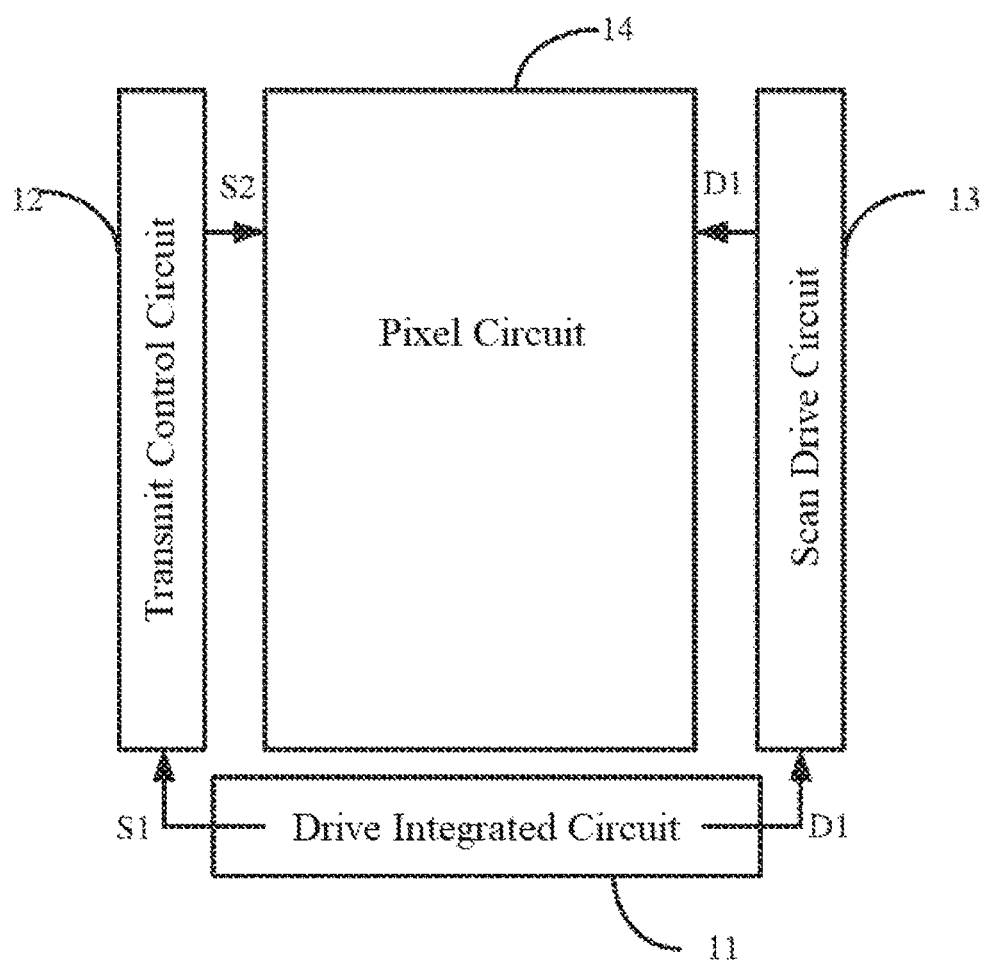
FIG. 1 is a structural schematic diagram of a drive control circuit provided by Embodiment 1 of the disclosure.

As shown in FIG. 1, FIG. 1 is a structural schematic diagram of a drive control circuit provided by Embodiment 1 of the disclosure. The drive control circuit mainly comprises a drive integrated circuit 11, a transmit control circuit 12, a scan drive circuit 13, and a pixel circuit 14; wherein: the drive integrated circuit 11 is configured to adjust a duty cycle of a drive signal to be outputted to generate a first drive signal S1 and transmit the first drive signal S1 to the transmit control circuit 12; and is configured to decrease the amplitude of a data signal to be outputted to generate a first data signal D1 and transmit the first data signal D1 to the scan drive circuit 13;
the transmit control circuit 12 is connected between the drive integrated circuit 11 and the pixel circuit 14 and configured to convert the received first drive signal S1 to a second drive signal S2 with a preset duty cycle and transmit the second drive signal S2 to the pixel circuit 14, and the preset duty cycle of the second drive signal S2 is greater than the duty cycle of the drive signal to be outputted;
the pixel circuit 14 is configured to perform drive control of the corresponding pixel unit according to the received second drive signal S2 and the first data signal D1 transmitted by the scan drive circuit 13.

In this embodiment, the drive control circuit 11 may specifically be a drive chip integrated with various circuit functions. The drive integrated circuit 11 provides the corresponding signals for the transmit control circuit 12 and the scan drive circuit 13 respectively and may also provide a high electrical level or a low electrical level for the transmit control circuit 12.

In addition, the drive integrated circuit 11, on one hand, can adjust the duty cycle of the drive signal supplied to the transmit control circuit 12 so that the generated first drive signal S1 can cooperate with the transmit control circuit 12 to form the second drive signal S2 with the preset duty cycle. The preset duty cycle of the second drive signal S2 is greater than the duty cycle of the drive signal to be outputted, i.e., the duty cycle of the second drive signal S2 is greater than that of the prior art, because in the prior art, the drive integrated circuit 11 directly transmits the drive signal which is to be outputted to the transmit control circuit 12. The transmit control circuit 12 generally only amplifies the current of the drive signal, and the drive signal is sequentially loaded to each row of the pixel circuit. As can be seen, the disclosure increases the duty cycle of the second drive signal loaded to each row of the pixel circuit by adjusting the duty cycle of the drive signal to be outputted in the drive integrated circuit 11. Moreover, considering that the OLED in the pixel circuit is illuminated when the drive signal is at a low electrical level, the duty cycle of the second drive signal is increased, meaning that the low electrical level lasts for a shorter period of time, i.e., the illuminating time of OLED in each frame is shorten. On the other hand, in order to ensure that the luminance of the whole screen remains unchanged after the duty cycle is adjusted, the drive integrated circuit 11 decreases the amplitude of the data signal loaded when data is written and improves the luminance of each OLED per unit time, thereby ensuring the unchanged luminance of the whole screen. The reason why the horizontal Mura phenomenon can be improved in the disclosure is that Mura caused by luminance differences between each row of the pixel circuit only occurs for a shorter period of time by shortening the time during which the OLED is illuminated in each frame, and further shortening the time during which Mura is occurred as a whole, thereby improving the horizontal Mura phenomenon exhibited when a screen displays.

In fact, in the embodiment of the disclosure, 1. the adjustment of the drive signal to be outputted by the drive integrated circuit 11 may be achieved by a duty cycle adjustment circuit; specifically, the duty cycle adjustment circuit is included in the drive integrated circuit and configured to adjust the duty cycle of the original drive signal; for example, the adjustment of the duty cycle of the drive signal with a duty cycle of 3% is performed so that the duty cycle of the original signal is adjusted to 60% by the duty cycle adjustment circuit; then, the signal with the duty cycle of 60% after adjusting, as a drive signal, is outputted to the transmit control circuit 12; 2. a duty cycle parameter needed to be adjusted is set in the drive integrated circuit 11 and directly outputted; specifically, a drive signal with a desired duty cycle is directly outputted; for example, the dive signal with a duty cycle of 60% is directly outputted to the transmit control circuit 12 so that the duty cycle of the drive signal may reach a desired value; wherein, when the duty cycle of the drive signal to be outputted is adjusted by the drive integrated circuit, specific adjustment modes and parameters may be chosen according to characteristics of the pixel circuit, wherein the characteristics of the pixel circuit may comprise display primary color, screen size, screen resolution and the like.

Optionally, in the embodiment of the disclosure, improvements of the circuit and function of the drive integrated circuit 11 may cooperate with the improvement of the transmit control circuit 12. Alternatively, the transmit control circuit 12 maintains the existing circuit structure.

Figure 2A:
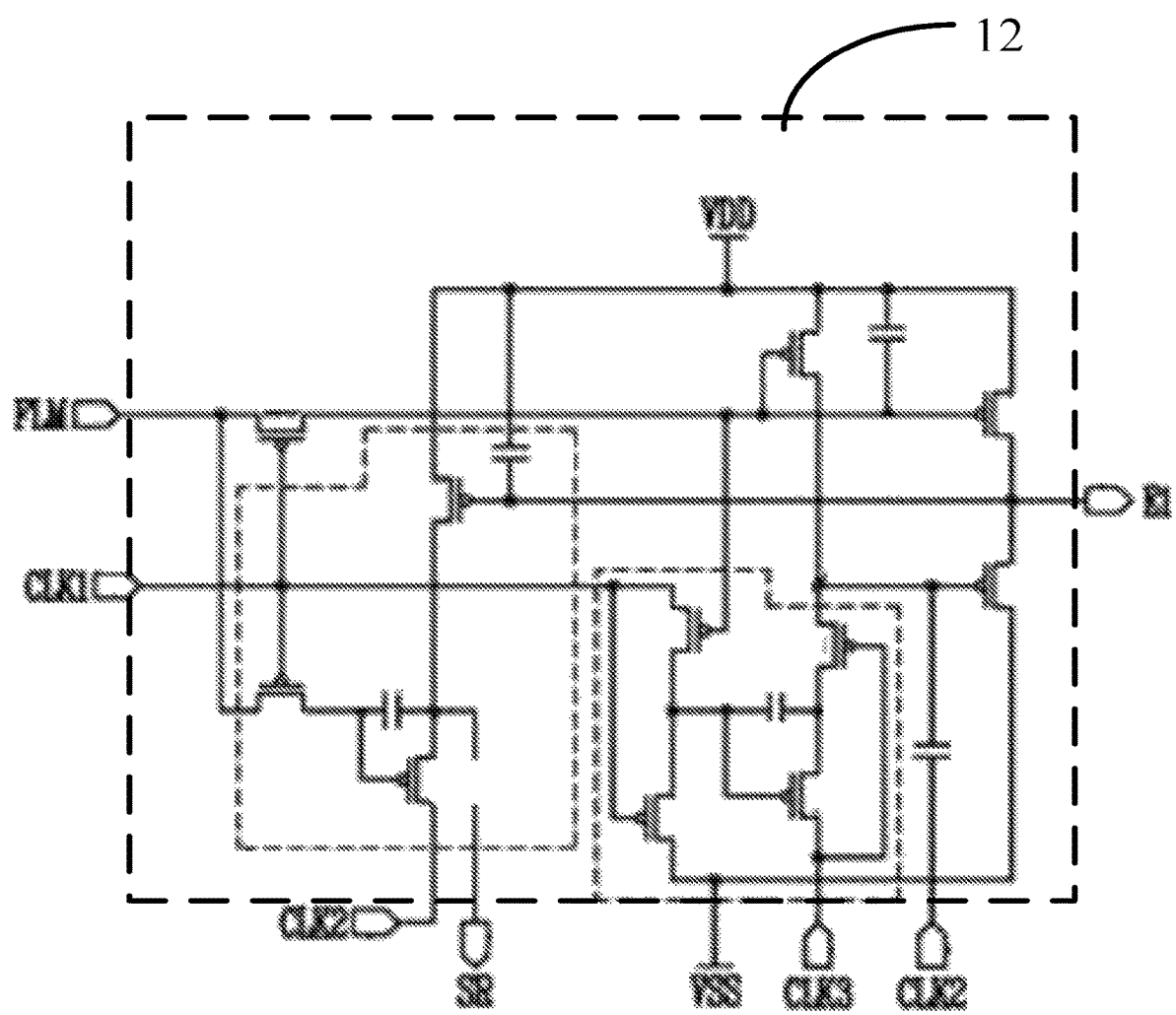
FIG. 2(a) is a structural schematic diagram of a transmit control circuit 12 in the prior art.

Specifically, if the transmit control circuit 12 maintains the existing circuit structure, it is necessary to make the proportional relationship between the duty cycle of the first drive signal and the preset duty cycle of the second drive signal be adapted according to the specific structure of the transmit control circuit 12. As shown in FIG. 2(*a*), a large number of circuit elements are included in the transmit control circuit 12 which will not be described one by one here. It should be noted that the transmit control circuit 12 receives the first drive signal and various clock signals transmitted by the drive integrated circuit 11, wherein, assuming that the drive integrated circuit 11 only adjusts the duty cycle of the first drive signal rather than other clock signals, a second drive signal with the preset duty cycle may be outputted after the amplification processing performed by the transmit control circuit 12. The reason why the amplification processing is required is that the first drive signal S1 is not a current signal required for a drive pixel circuit, so that the first drive signal S1 needs to be amplified to reach a drive threshold current at which the corresponding switch element in the pixel circuit may be switched on to illuminate each row of OLEDs in the pixel circuit.

Figure 2B:
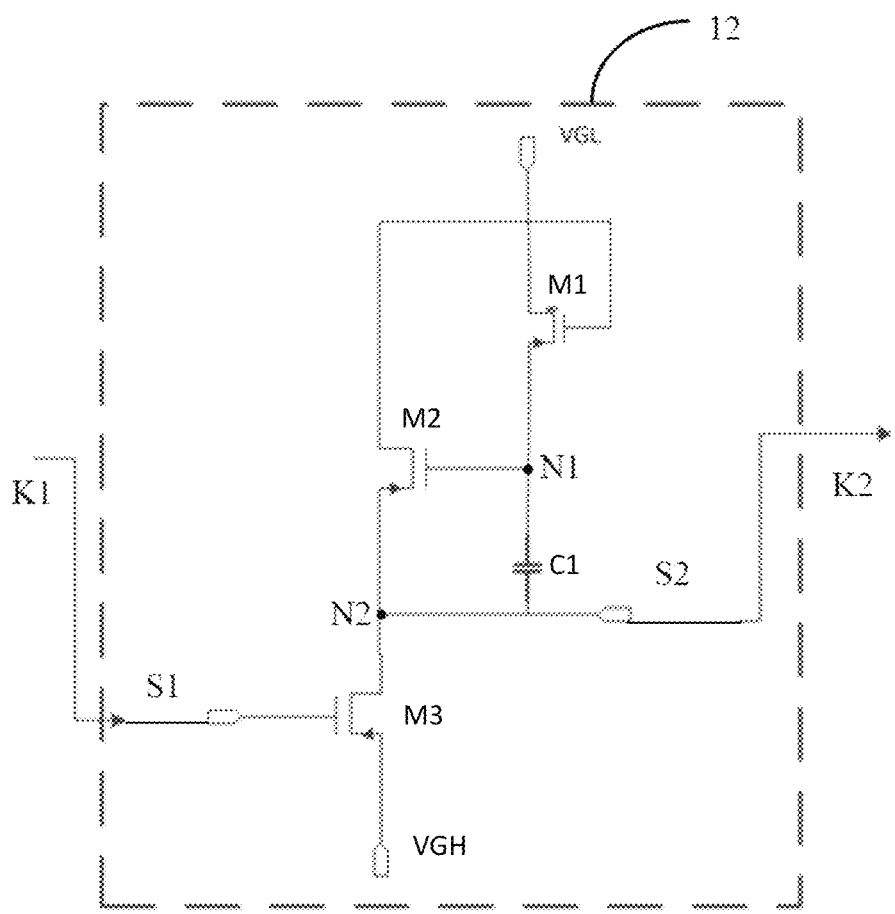
FIG. 2(b) is a structural schematic diagram of a simplified transmit control circuit in the technical solution of the disclosure.

If the circuit structure of the transmit control circuit 12 changes, for example, the circuit structure is simplified as the circuit structure as shown in the FIG. 2(b), the duty cycle of the first drive signal has a certain complementary relationship with the preset duty cycle of the second drive signal. Specifically, with reference to FIG. 2(b), firstly, considering the function of the circuit structure, the transmit control circuit 12 is configured to perform duty cycle inversion and current amplification processing of the received first drive signal S1 to generate the second drive signal S2 with the preset duty cycle. For example, when the circuit structure as shown in FIG. 2(b) is adopted, the role of the transmit control circuit 12, i.e., duty cycle inversion and current amplification, needs to be considered at this time to ensure that the duty cycle of the second drive signal is the preset duty cycle. Therefore, assuming that the preset duty cycle is 60%, and the second drive signal is obtained after a duty cycle inversion processing by the transmit control circuit 12, thus, the duty cycle of the first drive signal S1 may be determined as 40%. Further, in the drive integrated circuit 11, the first drive signal S1 with a duty cycle of 40% is necessarily generated finally via the adjustment, regardless of the value of the duty cycle of the drive signal to be outputted.

Further, based on the circuit structure as shown in FIG. 2(b), the transmit control circuit 12 is connected to the drive integrated circuit 11 via a signal input port K1, and to the pixel circuit 14 via a signal output port K2. Thus the connection mode of single input and single output may simplify the circuit connection structure, and achieve the purpose of sequentially outputting the second drive signal K2 only by arranging a timing control device inside the transmit control circuit 12.

Wherein, with reference to the circuit structure as shown in FIG. 2(b), the transmit control circuit 12 specifically comprises a first P-type field effect transistor M1, a second P-type field effect transistor M2, a third P-type field effect transistor M3, and a first capacitor C1, wherein a source of the first P-type field effect transistor M1 is connected to a first node N1, a gate of the first P-type field effect transistor M1 is connected to a drain of a second P-type field effect transistor M2, and the drain is connected to the low electrical level; a source of the second P-type field effect transistor M2 is connected to a second node N2, a gate of the second P-type field effect transistor M2 is connected to the first node N1, and the drain of the second P-type field effect transistor M2 is connected to the gate of the first P-type field effect transistor M1, a source of the third P-type field effect transistor M3 is connected to the high electrical level, and a gate of the third P-type field effect transistor M3 is connected to the signal input port K1, a drain of the third P-type field effect transistor M3 is connected to the second node N2; one end of the first capacitor C1 is connected to the first node N1, the other end is connected to the second node N2, and the second node N2 is connected to the signal output port K2.

Wherein both the high electrical level and low electrical level in the transmit control circuit 12 are provided by the drive integrated circuit 11, to achieve inversion and amplification of the first drive signal S1 in cooperation with each field effect transistor in the transmit control circuit 12.

Figure 3A:
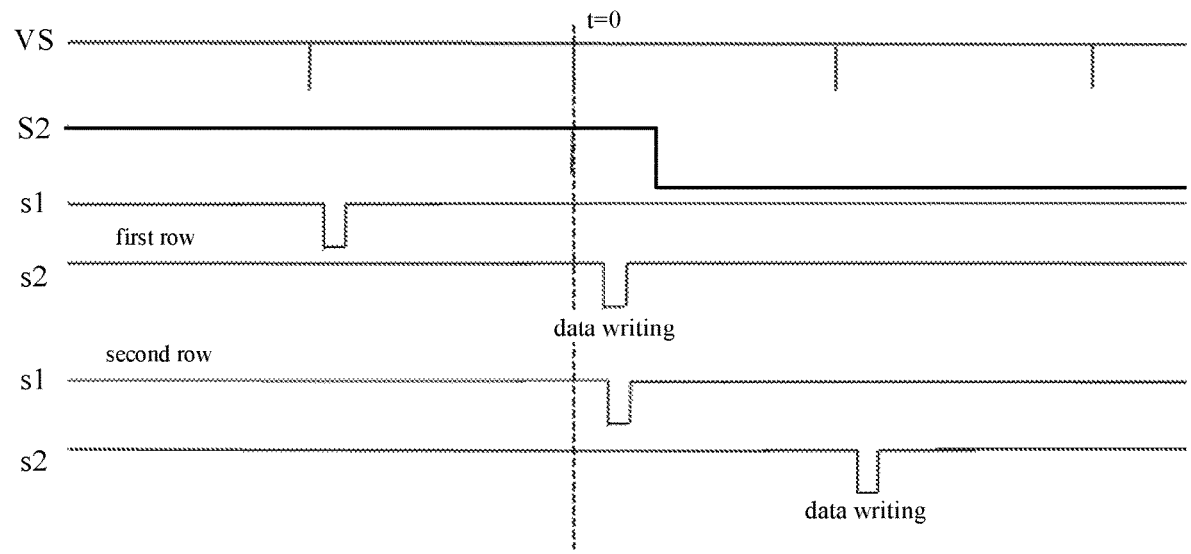
FIG. 3 (a) is a timing control diagram of the prior art.
FIG. 3(b) is a timing control diagram of the technical solution of the disclosure.
Figure 3B:
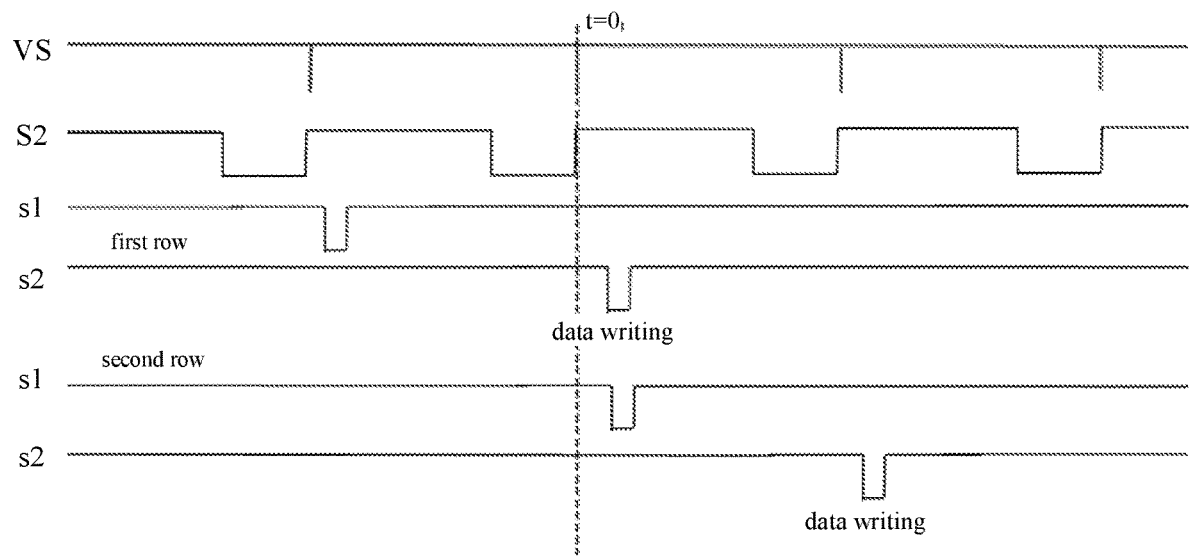

Optionally, in the embodiment of the disclosure, in order to further improve the horizontal Mura phenomenon found in the screen, the drive integrated circuit 11 is also configured to adjust a cycle of the drive signal to be outputted such that the cycle T1 of the second drive signal S2 transmitted to the pixel circuit 14 is the same as a row cycle T2. Specifically, it can be known from the existing timing control diagram shown in FIG. 3(a) and the timing control diagram of the disclosure shown in FIG. 3(b) that in the prior art, the cycle T1 of the second drive signal S2 is longer, significantly longer than the row cycle T2, and the duty cycle is smaller, so that the time during which OLED is in an illuminated state in the screen within one frame is longer and the subsequent illuminated state is almost continuous, and moreover, the Mura phenomenon is relatively obvious. However, in the disclosure, the cycle T1 of the second drive signal S2 is shorter, which is the same as the row cycle T2, and the duty cycle is larger, so that the time during which OLED is in an illuminated state in the screen within one frame is shorter and the illuminated state is discontinuous; in addition, the luminance of the OLED per unit time may be improved by adjusting the amplitude of a data signal. Thus, the horizontal Mura phenomenon is alleviated and the display quality is improved.

In addition, considering that the existing drive signal transmitted by the transmit control circuit has generally a duty cycle of 3%, i.e., the lighting time of OLED is very long and the time required for writing data is very short, it is only necessary to adjust the duty cycle of the drive signal to be outputted in the drive integrated circuit. However, considering that different adjustments may be made in the drive integrated circuit due to different transmit control circuits, the second drive signal with a duty cycle larger than 3% has to be ensured. In general, the duty cycle of the drive signal to be outputted is the duty cycle of the drive signal transmitted by the transmit control circuit in the prior art. In addition, in combination with the empirical values and a great number of experiments, and in light of hardware limitations, the value of the preset duty cycle in the disclosure is within the range from 40% to 90%. Wherein 60% is a preferable value.

In addition, the selection of the value of the preset duty cycle not only improves the horizontal Mura phenomenon found in the screen, but also ensures that, in the drive control process, the data signal may be fully written over a sufficiently long time during which the second drive signal is at high electrical level.

Embodiment 2

Figure 4:
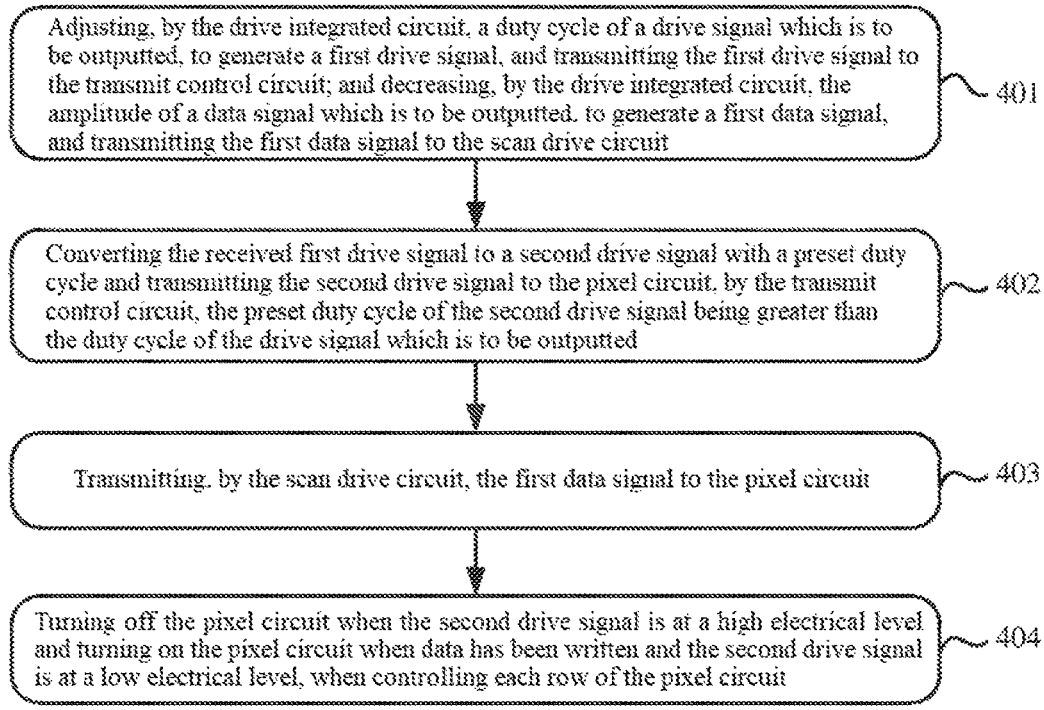
FIG. 4 is a schematic diagram showing the steps of a method for driving a drive control circuit provided by Embodiment 2 of the disclosure.

FIG. 4 is a schematic diagram showing the steps of a method for driving the above drive control circuit provided by Embodiment 2 of the disclosure, and the method comprises the following steps:

Step 401: adjusting, by a drive integrated circuit, a duty cycle of a drive signal to be outputted to generate a first drive signal, and transmitting the first drive signal to the transmit control circuit; and, decreasing the amplitude of a data signal to be outputted to generate a first data signal, and transmitting the first data signal to a scan drive circuit.

Step 402: converting, by the transmit control circuit, the received first drive signal to a second drive signal with a preset duty cycle, and transmitting the second drive signal to a pixel circuit, the preset duty cycle of the second drive signal being greater than the duty cycle of the drive signal to be outputted.

Step 403: transmitting, by the scan drive circuit, the first data signal to the pixel circuit.

Wherein the order of the step 402 and step 403 is not limited, and it is generally believed that these steps may be executed simultaneously according to a specific timing.

Figure 5:
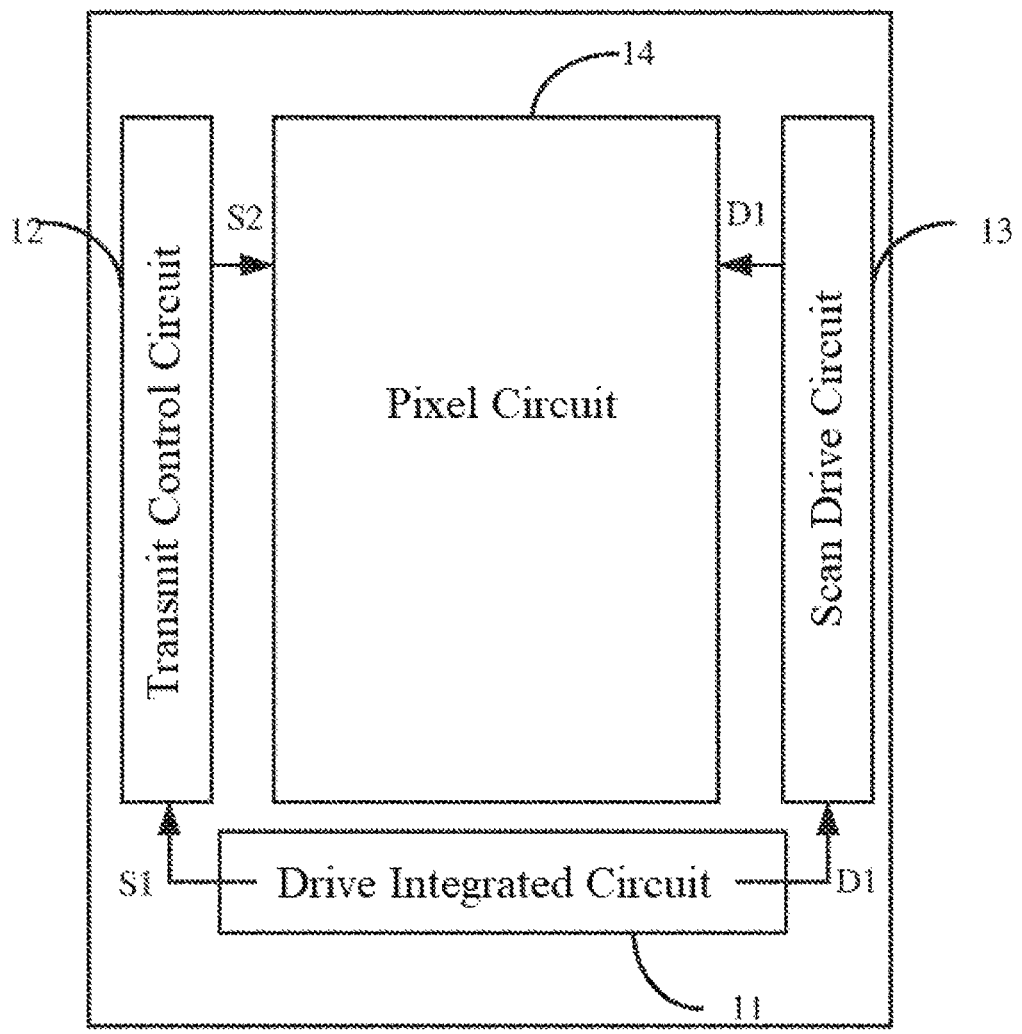
FIG. 5 is a structural schematic diagram of a display screen A provided by Embodiment 2 of the disclosure.

The solution involved in the above step 401 to step 404 is described below in detail by means of combining the specific embodiment with the structural schematic diagram of the display screen A as shown in FIG. 5:

A display screen A having a horizontal Mura is provided. The display screen A is provided with a driver IC, a transmit control circuit EM, a scan circuit S, and a pixel circuit M. The value of duty cycle needed to be adjusted by the disclosure is determined according to its model and the like. For example, the duty cycle of the drive signal currently outputted to the pixel circuit M is 3%, and the Mura is improved only when the duty cycle of the drive signal outputted to the pixel circuit M determined by the solution of the disclosure attains 60%. Wherein, the transmit control circuit EM adopts the circuit structure shown in FIG. 2(*b*).

First, the duty cycle of the original drive signal is increased by the drive IC from 3% to 40% to generate a signal X1, and the signal X1 is transmitted by the drive IC to the transmit control circuit EM. And signal inversion and amplification of the signal X1 are then performed by the transmit control circuit EM to obtain a signal X2 with a duty cycle of 60% and a strong driving force, which is transmitted to the pixel circuit M of the display screen A.

At the same time, the amplitude of the original data signal may be reduced by the drive IC as a signal Y1, and the value of the amplitude is specifically adjusted depending on conditions such as the model of the display screen A and the degree of Mura. And the parameters may be adjusted according to specific conditions, and the adjusted signal Y1 is transmitted by the driver IC to the scan drive circuit S. The scan drive circuit S performs timing control of the signal Y1 and transmits it to the pixel circuit M of the display screen A.

Finally, the display screen A is driven by the pixel circuit M of the display screen A in accordance with the signal X2 and the signal Y1.

Step 404: turning off the pixel circuit when the second drive signal is at a high electrical level and turning on the pixel circuit when data has been written and the second drive signal is at a low electrical level, when controlling each row of the pixel circuit.

Specifically, the specific timing control may be shown with reference to FIG. 3(*b*). Pixel points in the screen are progressively scanned by the scan signal s1 and the data signal s2 transmitted by the scan drive circuit cooperated with a second drive signal S2 and the data is written. Wherein, a row synchronizing signal VS is configured to synchronize the transmitting end of a signal with the receiving end of the signal; the scan signal s1 transmitted by the scan drive circuit is used for scan initialization of the pixel points in the screen line by line, and the data signal s2 transmitted by the scan drive circuit is used to progressively write data into the pixel points in the screen, and during the process of driving the pixel points at the same row in the screen and writing the data into the pixel points, the data signal s2 lags behind the scan signal s1. By the scan driving and data writing, pixels in the screen are turned on when the second drive signal S2 is at a low voltage, and pixels in the screen are turned off when the second drive signal S2 is at a high voltage. And the second drive signal S2 having a duty cycle of 60% causes the display time of the horizontal Mura displayed by the screen to be 40% of the total display time. Because the signal frequency is high and the display luminance per unit time of the screen is increased by adjusting the amplitude of the data signal, the horizontal Mura phenomenon cannot be easily captured by human eyes, thereby improving the horizontal Mura phenomenon exhibited in the screen and the display quality.

Embodiment 3

Figure 6:
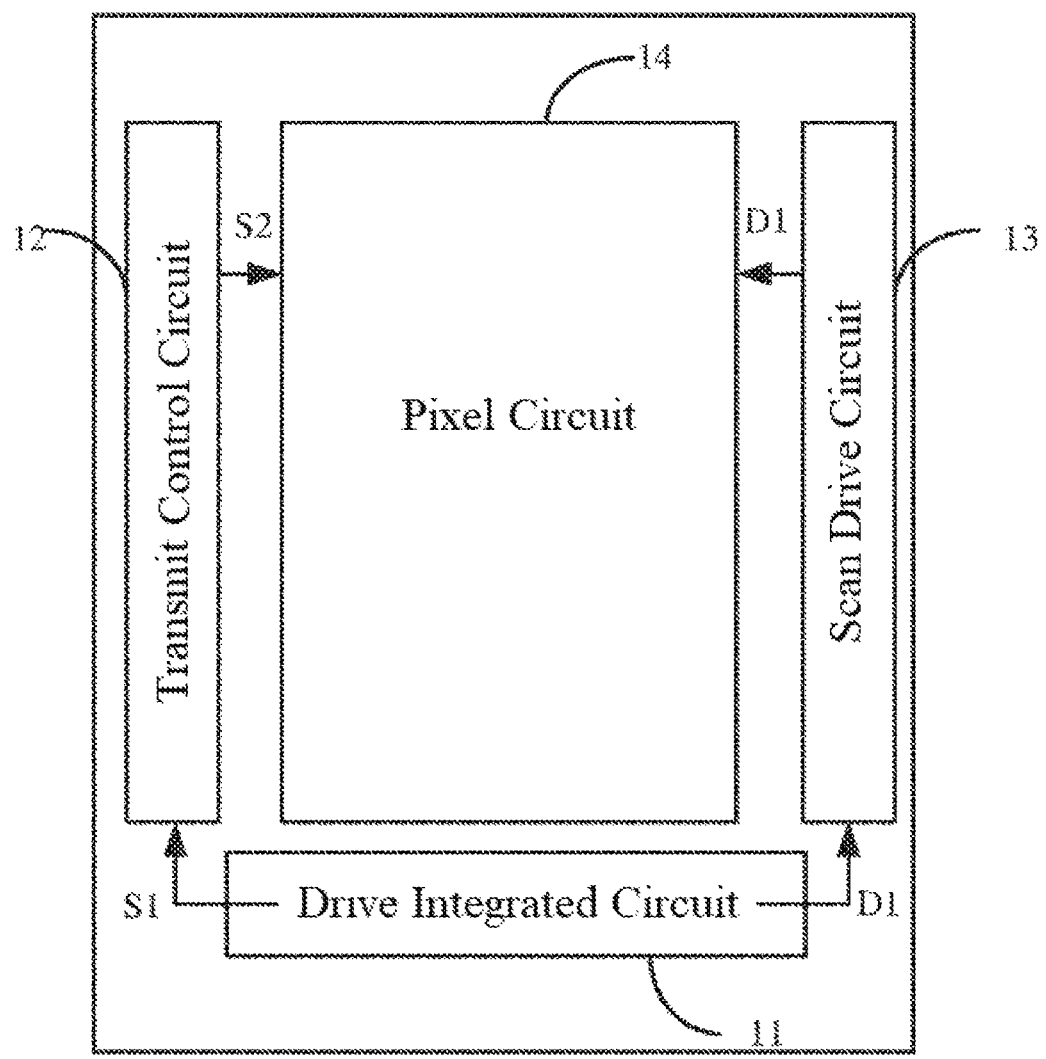
FIG. 6 is a structural schematic diagram of a display device provided by Embodiment 3 of the disclosure.

The disclosure also provides a display device comprising any of the above drive control circuits, as shown in FIG. 6. Specifically, the drive integrated circuit 11 is located at one edge region of the non-display area of the display device, the transmit control circuit 12 and the scan drive circuit 13 are disposed in edge regions at both sides of the display region respectively, and the pixel circuit 14 is disposed at the display region. Wherein the display device is specifically an AMOLED display device. In addition, the display device further comprises other display modules, such as a display substrate, a backplane, a touch screen and the like.

The above description is only examples of the disclosure and is not intended to limit the disclosure. For those skilled in the art, the disclosure may have various changes and variations. Any modifications, equivalent replacements and improvements made within the spirit and principle of the disclosure should fall into the scope of the claims of the disclosure.

What is claimed is:

1. A drive control circuit, comprising: a drive integrated circuit, a transmit control circuit, a scan drive circuit, and a pixel circuit; wherein the drive integrated circuit adjusts a duty cycle of a drive signal which is to be outputted, to generate a first drive signal, and transmits the first drive signal to the transmit control circuit; the drive integrated circuit decreases the amplitude of a data signal which is to be outputted, to generate a first data signal, and transmits the first data signal to the scan drive circuit;

the scan drive circuit receives the first data signal and transmits the first data signal to the pixel circuit;

the transmit control circuit, connected between the drive integrated circuit and the pixel circuit, receives the first drive signal and converts the received first drive signal to a second drive signal with a preset duty cycle, and transmits the second drive signal to the pixel circuit, the preset duty cycle of the second drive signal being greater than the duty cycle of the drive signal which is to be outputted;

the pixel circuit receives the second drive signal and controls the corresponding pixel unit according to the received second drive signal and the first data signal transmitted by the scan drive circuit;

wherein, the transmit control circuit comprises a first P-type field effect transistor, a second P-type field effect transistor, a third P-type field effect transistor, and a first capacitor;

a source of the first P-type field effect transistor is connected to a first node, a gate of the first P-type field effect transistor is connected to a drain of the second P-type field effect transistor, and the drain is connected to a low electrical level;

a source of the second P-type field effect transistor is connected to a second node, a gate of the second P-type field effect transistor is connected to the first node, and a drain of the second P-type field effect transistor is connected to the gate of the first P-type field effect transistor;

a source of the third P-type field effect transistor is connected to a high electrical level, and a gate of the third P-type field effect transistor is connected to a signal input port, and a drain of the third P-type field effect transistor is connected to the second node;

one end of the first capacitor is connected to the first node, the other end is connected to the second node, and the second node is connected to a signal output port.

2. The drive control circuit according to claim 1, wherein, the transmit control circuit converts the received first drive signal to the second drive signal with the preset duty cycle by performing duty cycle inversion and current amplification processing of the received first drive signal, to generate the second drive signal with the preset duty cycle.

3. The drive control circuit according to claim 2, wherein, the transmit control circuit is connected to the drive integrated circuit via Hall the signal input port, and to the pixel circuit via the signal output port.

4. The drive control circuit according to claim 1, wherein, the drive integrated circuit further adjusts a cycle of the drive signal which is to be outputted, to make a cycle of the second drive signal transmitted to the pixel circuit be the same as a row cycle.

5. The drive control circuit according to claim 1, wherein, the preset duty cycle ranges from 40% to 90%.

6. A method for driving the drive control circuit according to claim 1, comprising the following steps:

adjusting, by the drive integrated circuit, a duty cycle of a drive signal which is to be outputted, to generate a first drive signal, and transmitting the first drive signal to the transmit control circuit; and decreasing, by the drive integrated circuit, the amplitude of a data signal which is to be outputted, to generate a first data signal, and transmitting the first data signal to the scan drive circuit;

receiving and converting the first drive signal to a second drive signal with a preset duty cycle, and transmitting the second drive signal to the pixel circuit, by the transmit control circuit, the preset duty cycle of the second drive signal being greater than the duty cycle of the drive signal which is to be outputted; and transmitting, by the scan drive circuit, the first data signal to the pixel circuit.

7. A display device, comprising the drive control circuit according to claim 1.

8. The display device according to claim 7, wherein, the display device is an AMOLED display device.

9. The method according to claim 6, further comprising controlling each row of the pixel circuit, wherein the controlling each row of the pixel circuit comprises turning off the pixel circuit when the second drive signal is at a high electrical level.

10. The method according to claim 9, wherein the controlling each row of the pixel circuit further comprises turning on the pixel circuit when data has been written and the second drive signal is at a low electrical level.

* * * * *